US007192486B2

(12) United States Patent
Bang et al.

(10) Patent No.: US 7,192,486 B2
(45) Date of Patent: Mar. 20, 2007

(54) CLOG-RESISTANT GAS DELIVERY SYSTEM

(75) Inventors: Won Bang, Santa Clara, CA (US); Yen-Kun Wang, Fremont, CA (US); Steve Ghanayem, Los Altos, CA (US)

(73) Assignee: Applied Materials, Inc., Santa Clara, CA (US)

( * ) Notice: Subject to any disclaimer, the term of this patent is extended or adjusted under 35 U.S.C. 154(b) by 159 days.

(21) Appl. No.: 10/222,398

(22) Filed: Aug. 15, 2002

(65) Prior Publication Data

US 2004/0083962 A1    May 6, 2004

(51) Int. Cl.
C23C 16/00 (2006.01)
C23C 16/448 (2006.01)
C23C 16/52 (2006.01)

(52) U.S. Cl. .................. 118/715; 118/726; 118/663; 118/666; 118/692; 118/696; 118/697

(58) Field of Classification Search ............ 118/715, 118/726, 663, 692, 666, 696, 697; 156/345.24, 156/345.26, 345.27, 345.29, 345.33, 345.34
See application file for complete search history.

(56) References Cited

U.S. PATENT DOCUMENTS

| | | | | |
|---|---|---|---|---|
| 3,403,544 A | * | 10/1968 | Francisco, Jr. ............... 73/1.21 |
| 4,768,291 A | * | 9/1988 | Palmer ....................... 34/443 |
| 5,091,207 A | * | 2/1992 | Tanaka ........................ 427/8 |
| 5,129,418 A | * | 7/1992 | Shimomura et al. ........ 137/486 |
| 5,186,120 A | | 2/1993 | Ohnishi et al. |
| 5,203,925 A | * | 4/1993 | Shibuya et al. ............. 118/724 |
| 5,204,314 A | | 4/1993 | Kirlin et al. |
| 5,372,754 A | * | 12/1994 | Ono ........................... 261/142 |
| 5,419,924 A | * | 5/1995 | Nagashima et al. ...... 427/248.1 |
| 5,496,408 A | * | 3/1996 | Motoda et al. ............. 118/715 |
| 5,536,323 A | | 7/1996 | Kirlin et al. |
| 5,538,220 A | * | 7/1996 | LaMarca ................. 251/129.15 |
| 5,605,179 A | * | 2/1997 | Strong et al. ................ 137/884 |
| 5,607,282 A | * | 3/1997 | Brannen et al. .......... 414/796.3 |
| 5,690,743 A | * | 11/1997 | Murakami et al. .......... 118/715 |
| 5,702,532 A | * | 12/1997 | Wen et al. ................... 118/730 |
| 5,711,816 A | | 1/1998 | Kirlin et al. |
| 5,730,804 A | * | 3/1998 | Gomi et al. ................. 118/726 |
| 5,766,360 A | | 6/1998 | Sato et al. |
| 5,785,796 A | * | 7/1998 | Lee ........................ 156/345.24 |
| 5,876,503 A | | 3/1999 | Roeder et al. |
| 5,925,189 A | | 7/1999 | Nguyen et al. |

(Continued)

FOREIGN PATENT DOCUMENTS

JP           56-14432    *    2/1981

(Continued)

OTHER PUBLICATIONS

PDC, Engineering Information for PDC Butterfly Valves, Process Development & Control, Inc. Product Catalogue, http://www.pdcvalve.com/products.html.

*Primary Examiner*—Jeffrie R. Lund
(74) *Attorney, Agent, or Firm*—Townsend and Townsend and Crew LLP

(57) ABSTRACT

Processing gases reactive with each other are provided in parallel to a processing chamber through separate delivery lines including mass flow controllers devoted to each line. The parallel delivery lines meet in a mixing manifold located proximate to the processing chamber and relatively far downstream from the mass flow controllers and other flow-constricting components of the gas delivery system. The continuous high flow of gas provided by the devoted mass flow controllers may maintain a sufficiently high pressures on the delivery lines to prevent partial clogging from leading to a further drop in pressure and complete obstruction of the delivery line.

18 Claims, 6 Drawing Sheets

U.S. PATENT DOCUMENTS

| | | | |
|---|---|---|---|
| 5,935,283 A | 8/1999 | Sweeney et al. | |
| 5,950,675 A * | 9/1999 | Minami et al. | 137/606 |
| 6,083,321 A * | 7/2000 | Lei et al. | 118/719 |
| 6,126,753 A * | 10/2000 | Shinriki et al. | 118/715 |
| 6,179,277 B1 | 1/2001 | Huston et al. | |
| 6,189,482 B1 * | 2/2001 | Zhao et al. | 118/723 R |
| 6,217,659 B1 * | 4/2001 | Botelho et al. | 118/715 |
| 6,261,374 B1 | 7/2001 | Bang et al. | |
| 6,314,986 B1 * | 11/2001 | Zheng et al. | 137/240 |
| 6,328,560 B1 * | 12/2001 | Fujikawa et al. | 432/205 |
| 6,345,642 B1 | 2/2002 | Yoshidome et al. | |
| 6,349,887 B1 | 2/2002 | Pyo | |
| 6,375,753 B1 | 4/2002 | Tolia et al. | |
| 6,413,583 B1 * | 7/2002 | Moghadam et al. | 427/249.15 |
| 6,428,850 B1 * | 8/2002 | Shinriki et al. | 427/255.32 |
| 6,616,973 B1 * | 9/2003 | Nguyen et al. | 427/255.38 |
| 6,635,114 B2 | 10/2003 | Zhao et al. | 118/715 |
| 7,055,808 B2 * | 6/2006 | Sivaramakrishnan et al. | 261/62 |
| 7,056,360 B2 * | 6/2006 | Zeck | 48/195 |
| 7,114,531 B2 * | 10/2006 | Silva | 141/3 |
| 2001/0006705 A1 * | 7/2001 | Takeshima | 427/255.28 |
| 2002/0000195 A1 | 1/2002 | Bang et al. | |
| 2002/0007802 A1 * | 1/2002 | Chen et al. | 122/4 R |
| 2003/0005823 A1 * | 1/2003 | Le Blanc et al. | 95/149 |
| 2004/0007177 A1 * | 1/2004 | Ohmi et al. | 118/715 |
| 2004/0083962 A1 * | 5/2004 | Bang et al. | 118/715 |
| 2004/0163590 A1 * | 8/2004 | Tran et al. | 118/715 |
| 2005/0016956 A1 * | 1/2005 | Liu et al. | 216/67 |
| 2006/0011258 A1 * | 1/2006 | Silva | 141/63 |

FOREIGN PATENT DOCUMENTS

| | | | |
|---|---|---|---|
| JP | 61-43414 | * | 3/1986 |
| JP | 5-339732 | * | 12/1993 |
| JP | 2000-334290 | * | 12/2000 |

* cited by examiner

CLOG-RESISTANT GAS DELIVERY SYSTEM

BACKGROUND OF THE INVENTION

Chemical vapor deposition (CVD) and other processing employed in the fabrication of semiconductor devices may utilize a number of gases or vaporized processing liquids. These gases, which may take the form of vaporized liquid precursors, are generated and supplied to a CVD chamber via a system of pipes or lines and vaporizing mechanisms known as a gas delivery system. Typically a separate vaporizing mechanism is provided for vaporizing each processing liquid, and is coupled to a source of processing liquid and a source of carrier gas. Each vaporizing mechanism and processing liquid source combination within a gas delivery system is referred to as a vaporization stage. Although a number of vaporizing mechanisms exist (e.g., bubblers, injection valves, etc.), most conventional gas delivery systems employ a plurality of injection valves for vaporizing processing liquids to be delivered to a CVD chamber.

A typical injection valve comprises a processing liquid inlet for receiving a pressurized processing liquid, a carrier gas inlet for receiving a pressurized inert carrier gas, and an outlet for delivering a vaporized processing liquid/carrier gas mixture. The injection valve is heated such that when the processing liquid is injected into the carrier gas, the heat and the low partial vapor pressure of the processing liquid in the carrier gas causes the processing liquid to vaporize. A high carrier gas pressure produces more processing liquid vaporization by lowering the partial vapor pressure of the processing liquid within the carrier gas. Accordingly, when designing a gas delivery system, maintenance of adequate carrier gas pressure is an important consideration, as is minimizing overall system size and complexity.

To achieve a low partial vapor pressure for each processing liquid while minimizing system size, conventional gas delivery systems are configured such that a carrier gas is delivered (via a mass flow controller) to a first injection valve, where it is used to vaporize a first processing liquid, forming a first vaporized processing liquid/carrier gas mixture. The first vaporized processing liquid/carrier gas mixture then is delivered in serial to the carrier gas inlet of a second, consecutive injection valve where it is used to vaporize a second processing liquid. A mixture of the first and second vaporized processing liquids and the carrier gas is then delivered in serial to the carrier gas inlet of a third consecutive injection valve, etc. These configurations provide a compact and cost-effective system, as they employ a single gas line and a single carrier gas source controlled by a single mass flow controller to achieve vaporization within each of the various vaporization stages. Additionally, conventional gas delivery systems facilitate vaporization of liquid precursors, as the entire mass flow of the carrier gas is applied to each injection valve in the series.

Despite their overall compact and efficient design, maintenance of conventional gas delivery systems may be expensive due to injection valve clogging. A clogged injection valve can cause downtime not only of the chamber to which the clogged injection valve is coupled, but also of upstream and/or downstream chambers. In addition to costly chamber downtime, injection valves themselves are expensive, typically costing more than two thousand dollars to replace, exclusive of labor costs. Thus, considerable effort has been devoted to developing clog resistant gas delivery systems, and numerous advances have been achieved.

One advance over conventional approaches is the recognition by Applied Materials, Inc., that alloys containing nickel react with the CVD processing liquid precursor triethylphosphate (TEPO), causing residue formation and clogging, and also the recognition that chromium can repress the nickel/TEPO reaction. Thus, gas delivery components made with less than 1% nickel and with 16–27% chromium significantly reduce clogging as described in commonly assigned U.S. Pat. No. 5,925,189. Despite such advances, gas delivery systems may experience clogging, particularly when a gas delivery system is employed in high performance, high pressure applications.

Accordingly, a need exists for a clog-resistant gas delivery systems able to handle flows of reactive gases at high pressures.

BRIEF SUMMARY OF THE INVENTION

Embodiments in accordance with the present invention provide processing gases reactive with each other in parallel to a processing chamber through separate delivery lines including devoted mass flow controllers. The parallel delivery lines meet in a mixing manifold located proximate to the processing chamber and relatively far downstream from the mass flow controllers and other flow-constricting components of the gas delivery system. The continuous high flow of gas provided by the devoted mass flow controllers may maintain sufficiently high pressures on the delivery lines to prevent partial clogging of a component from leading to a further drop in pressure and complete obstruction of the delivery line.

An embodiment of an apparatus in accordance with the present invention for providing to a semiconductor processing chamber a first processing gas and a second processing gas reactive with the first processing gas comprises a mixing structure in fluid communication with the processing chamber. A first gas delivery line is in fluid communication with the mixing structure and with a first processing gas source through a first mass flow controller, the first processing gas source comprising a first pressurized carrier gas flow in fluid communication with a first processing liquid of a first vaporization stage. A second gas delivery line separate from the first gas delivery line is in fluid communication with the mixing structure and with a second processing gas source through a second mass flow controller different from the first mass flow controller, the second processing gas source comprising a second pressurized carrier gas flow in fluid communication with a second processing liquid of a second vaporization stage.

An embodiment of a method in accordance with the present invention for providing to a semiconductor processing chamber a first processing gas and a second processing gas reactive with the first processing gas comprises flowing a first carrier gas through a first mass flow controller to a first vaporization stage in fluid communication with a first processing liquid such that the first processing liquid is vaporized and flowed into a mixing manifold through a first delivery line. A second carrier gas is flowed through a second mass flow controller different from the first mass flow controller to a second vaporization stage in fluid communication with a second processing liquid, such that the second processing liquid is vaporized and flowed into the mixing manifold through a second delivery line different from the first delivery line. The first vaporized processing liquid is mixed with the second vaporized processing liquid in the mixing manifold, and a mixture of the first vaporized processing liquid and the second vaporized processing liquid is flowed from the mixing manifold to a processing chamber.

These and other embodiments of the present invention, as well as its advantages and features, are described in more detail in conjunction with the text below and attached figures.

DESCRIPTION OF THE SPECIFIC EMBODIMENTS

Exemplary Deposition System

Figure 1A:
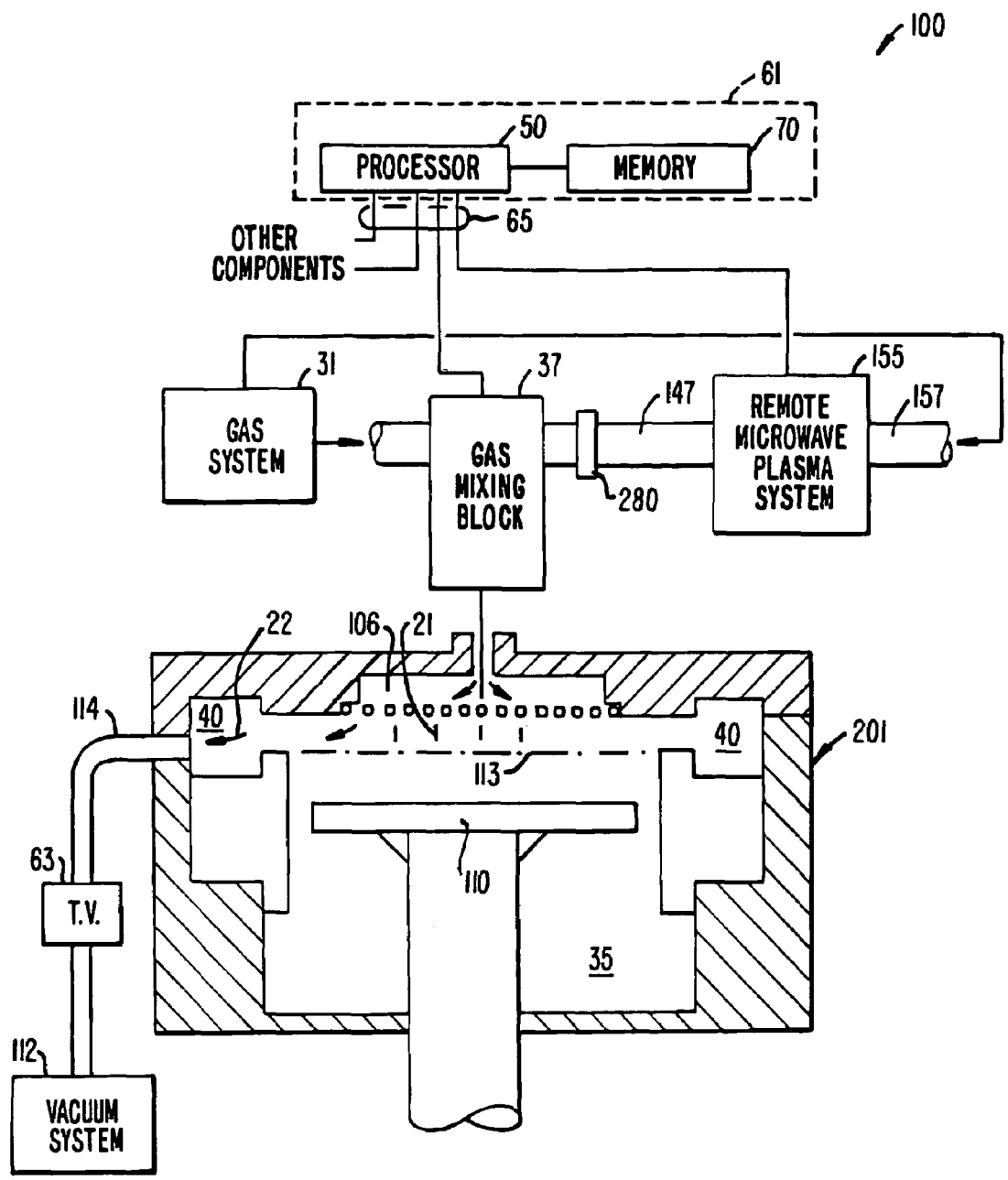
FIG. 1A is a simplified representation of a CVD apparatus according to the present invention.

FIG. 1A is a simplified diagram of a chemical vapor deposition ("CVD") system 100 according to the present invention. This system is suitable for performing thermal, sub-atmospheric CVD ("SACVD") processes, as well as other processes, such as reflow, drive-in, cleaning, etching, and gettering processes. Multiple-step processes can also be performed on a single substrate or wafer without removing the substrate from the chamber. The major components of the system include, among others, a vacuum chamber 35 that receives process and other gases from a gas delivery system 31, a vacuum system 112, a remote microwave plasma system 155, and a system controller 61. These and other components are described below in order to understand the present invention.

The CVD apparatus 100 includes an enclosure assembly 201 housing a vacuum chamber 35 with a gas reaction area 21. A gas distribution plate 106 is provided above the central gas reaction area 21 for dispersing reactive gases and other gases, such as purge gases, through perforated holes in the gas distribution plate 106 to a wafer (not shown) that rests on a vertically movable heater 110 (also referred to as a wafer support pedestal). The heater 110 can be controllably moved between a lower position, where a wafer can be loaded or unloaded, for example, and a processing position closely adjacent to the gas distribution plate 106, indicated by a dashed line 113, or to other positions for other purposes, such as for an etch or cleaning process. A center board (not shown) includes sensors for providing information on the position of the wafer.

The heater 110 includes an electrically resistive heating element (not shown) enclosed in a ceramic. The ceramic protects the heating element from potentially corrosive chamber environments and allows the heater to attain temperatures up to about 600° C. or even higher. In an exemplary embodiment, all surfaces of the heater 110 exposed to the vacuum chamber 35 are made of a ceramic material, such as aluminum oxide ($Al_2O_3$ or alumina) or aluminum nitride.

Reactive and carrier gases are supplied into a gas mixing manifold (also called a gas mixing box or block) 37, where they are preferably mixed together and delivered to the gas distribution plate 106. The gas mixing box 37 may comprise a dual input mixing block coupled to a gas delivery system 31 and to a cleaning/etch gas conduit 147. A valve 280 operates to admit or seal gas or plasma from the gas conduit 147 to the gas mixing block 37. The gas conduit 147 receives gases from an integral remote microwave plasma system 155, which has an inlet 157 for receiving input gases. During deposition processing, gas supplied to the plate 106 is vented toward the wafer surface where it may be uniformly distributed radially across the wafer surface, typically in a laminar flow.

Purging gas may be delivered into the vacuum chamber 35 from the plate 106 and/or an inlet port or tube (not shown in FIG. 1A) through the bottom wall of enclosure assembly 201. The purging gas flows upward from the inlet port past the heater 110 and to an annular pumping channel 40. An exhaust system then exhausts the gas (as indicated by arrows 22) into the annular pumping channel 40 and through an exhaust line 114 to a vacuum system 112, which includes a vacuum pump (not shown). Exhaust gases and entrained particles are drawn from the annular pumping channel 40 through the exhaust line 114 at a rate controlled by a throttle valve system 63.

The remote microwave plasma system 155 can produce a plasma for selected applications, such as chamber cleaning or etching native oxide or residue from a process wafer. Plasma species produced in the remote plasma system 155 from precursors supplied via the input line 157 are sent via the conduit 147 for dispersion through the plate 106 to the vacuum chamber 35. Precursor gases for a cleaning application may include fluorine, chlorine, and other reactive elements. The remote microwave plasma system 155 also may be adapted to deposit plasma-enhanced CVD films by selecting appropriate deposition precursor gases for use in the remote microwave plasma system 155.

The system controller 61 controls activities and operating parameters of the deposition system. The processor 50 executes system control software, such as a computer program stored in a memory 70 coupled to the processor 50. Preferably, the memory 70 may be a hard disk drive, but of course the memory 70 may be other kinds of memory, such as read-only memory or flash memory. In addition to a hard disk drive (e.g., memory 70), the CVD apparatus 100 in a preferred embodiment includes a floppy disk drive and a card rack (not shown).

The processor 50 operates according to system control software, which includes sets of instructions that dictate the timing, mixture of gases, chamber pressure, chamber temperature, microwave power levels, susceptor position, and other parameters of a particular process. Other computer programs such as those stored on other memory including, for example, a floppy disk or another computer program product inserted in a disk drive or other appropriate drive, may also be used to operate the processor 50 to configure the CVD system 10 into various apparatus.

The processor 50 has a card rack (not shown) that contains a single-board computer, analog and digital input/output boards, interface boards and stepper motor controller boards. Various parts of the CVD system 100 conform to the Versa Modular European (VME) standard which defines board, card cage, and connector dimensions and types. The VME standard also defines the bus structure having a 16-bit data bus and 24-bit address bus.

Figure 1B:
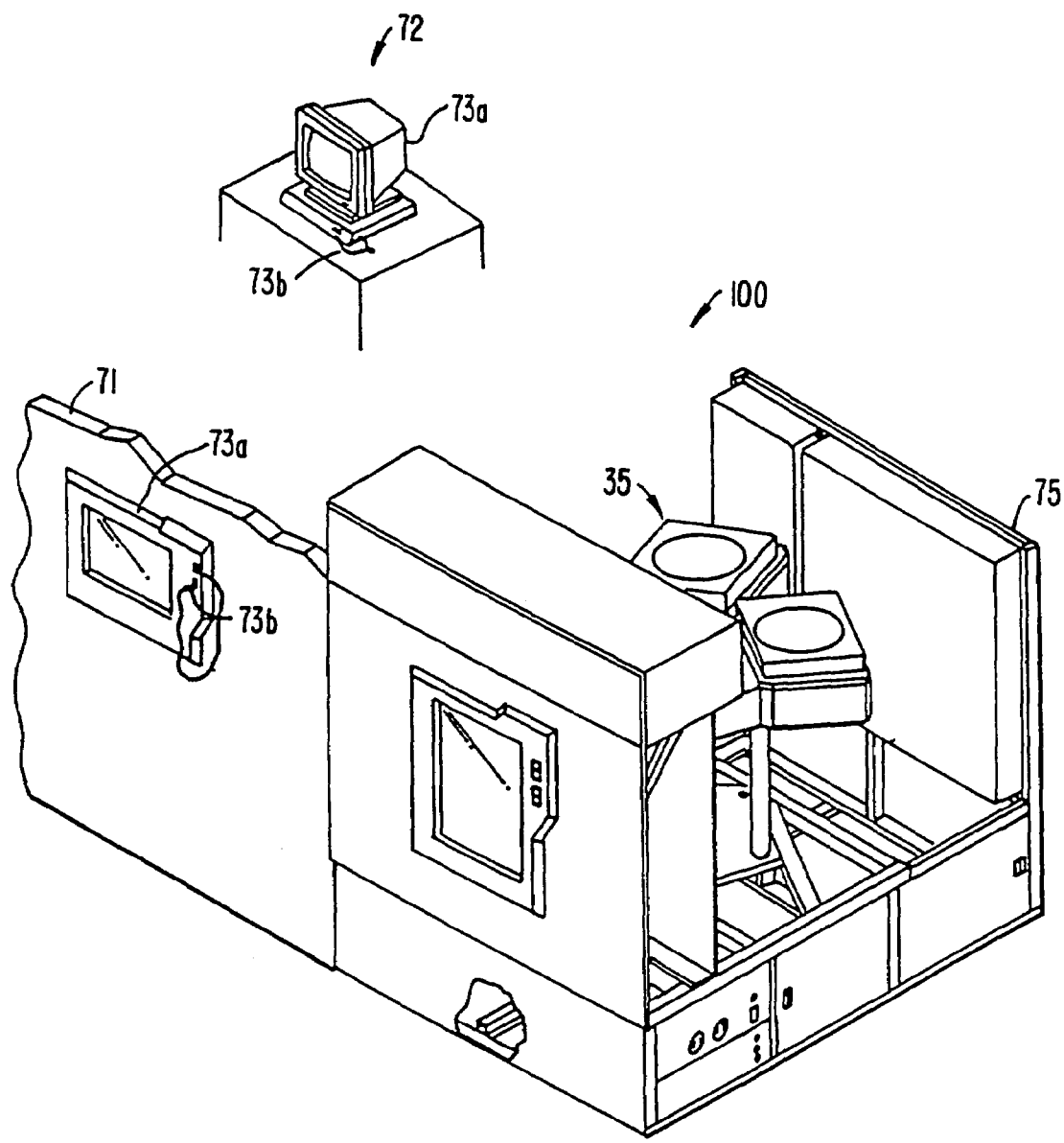
FIG. 1B is a simplified representation of the user interface for a CVD system in relation to a deposition chamber in a multi-chamber system.

FIG. 1B is a simplified diagram of a user interface in relation to the CVD apparatus chamber 35. The CVD apparatus 100 includes one chamber of a multichamber system. Wafers may be transferred from one chamber to another for additional processing. In some cases the wafers are transferred under vacuum or a selected gas. The interface between a user and the processor is via a CRT monitor 73a and a light pen 73b. A mainframe unit 75 provides electrical, plumbing, and other support functions for the CVD apparatus 100. Exemplary mainframe units compatible with the illustrative embodiment of the CVD apparatus are currently commercially available as the PRECISION 5000® and the CENTUR® 5200 systems from APPLIED MATERIALS, INC. of Santa Clara, Calif.

In the preferred embodiment two monitors 73a are used, one mounted in the clean room wall 71 for the operators, and the other behind the wall 72 for the service technicians. Both monitors 73a simultaneously display the same information, but only one light pen 73b is enabled. The light pen 73b detects light emitted by the CRT display with a light sensor in the tip of the pen. To select a particular screen or function, the operator touches a designated area of the display screen and pushes the button on the pen 73b. The touched area changes its highlighted color, or a new menu or screen is displayed, confirming communication between the light pen and the display screen. Of course, other devices, such as a keyboard, mouse, or other pointing or communication device, may be used instead of or in addition to the light pen 73b to allow the user to communicate with the processor.

Figure 1C:
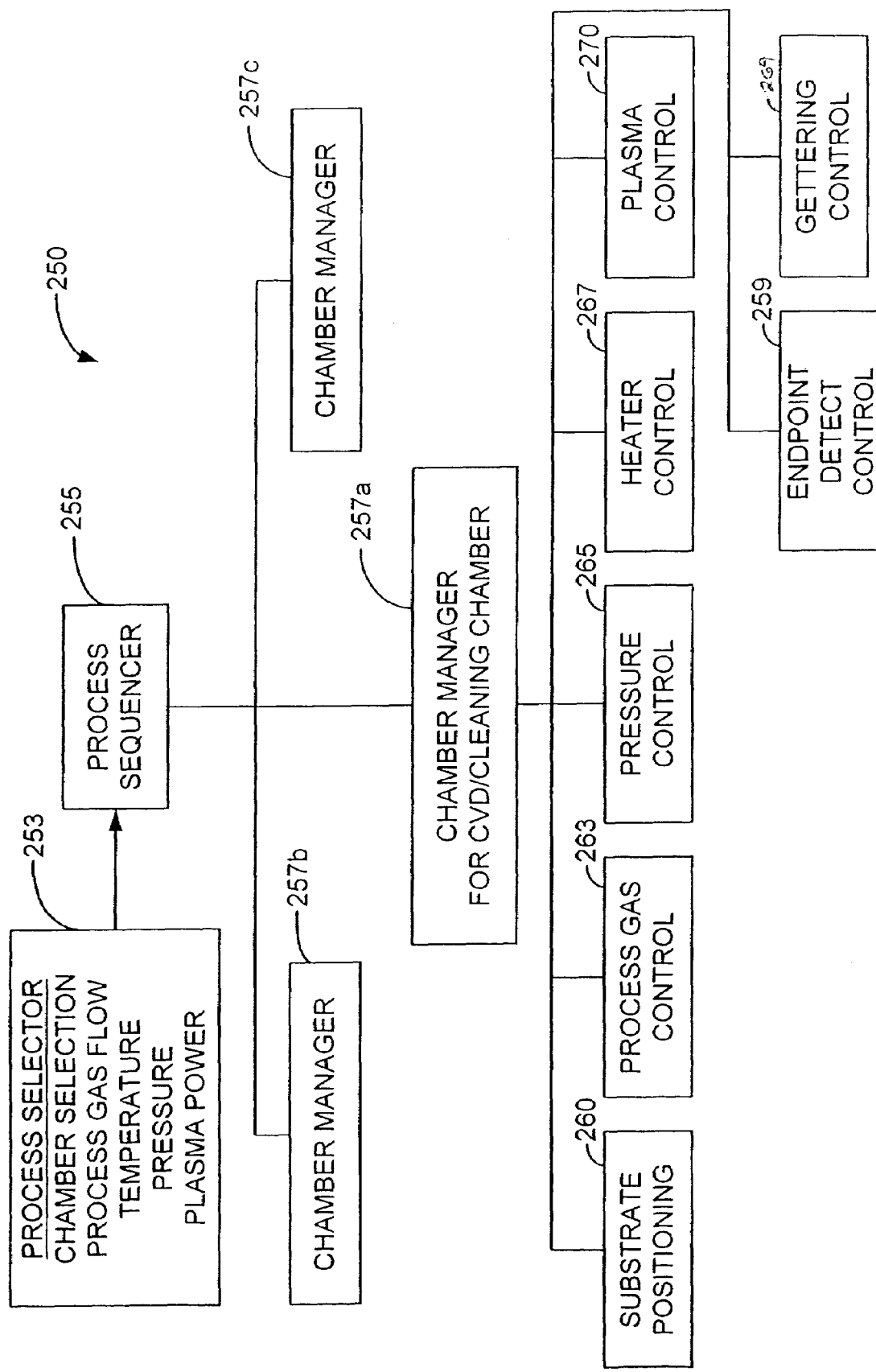
FIG. 1C is a simplified of a block diagram of the hierarchical control structure of the system control software according to a specific embodiment.

FIG. 1C is an illustrative block diagram of the hierarchical control structure of the system control software, computer program 250, according to a specific embodiment. A processes for depositing a film, performing a clean, or performing reflow or drive-in can be implemented using a computer program product that is executed by the processor 50. The computer program code can be written in any conventional computer readable programming language, such as 68000 assembly language, C, C++, Pascal, Fortran, or other language. Suitable program code is entered into a single file, or multiple files, using a conventional text editor and is stored or embodied in a computer-usable medium, such as the system memory.

If the entered code text is in a high-level language, the code is compiled, and the resultant compiler code is then linked with an object code of precompiled WINDOWS™ library routines. To execute the linked compiled object code, the system user invokes the object code, causing the computer system to load the code in memory, from which the CPU reads and executes the code to configure the apparatus to perform the tasks identified in the program.

A user enters a process set number and process chamber number into a process selector subroutine 253 by using the light pen to select a choice provided by menus or screens displayed on the CRT monitor. The process sets, which are predetermined sets of process parameters necessary to carry out specified processes, are identified by predefined set numbers. The process selector subroutine 253 identifies (i) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as magnetron power levels (and alternatively to or in addition to high- and low-frequency RF power levels and the low-frequency RF frequency, for embodiments equipped with RF plasma systems), cooling gas pressure, and chamber wall temperature. The process selector subroutine 253 controls what type of process (e.g. deposition, wafer cleaning, chamber cleaning, chamber gettering, reflowing) is performed at a certain time in the chamber. In some embodiments, there may be more than one process selector subroutine. The process parameters are provided to the user in the form of a recipe and may be entered utilizing the light pen/CRT monitor interface.

A process sequencer subroutine 255 has program code for accepting the identified process chamber and process parameters from the process selector subroutine 253, and for controlling the operation of the various process chambers. Multiple users can enter process set numbers and process chamber numbers, or a single user can enter multiple process set numbers and process chamber numbers, so process sequencer subroutine 255 operates to schedule the selected processes in the desired sequence. Preferably, the process sequencer subroutine 255 includes program code to perform the steps of (i) monitoring the operation of the process chambers to determine if the chambers are being used, (ii) determining what processes are being carried out in the chambers being used, and (iii) executing the desired process based on availability of a process chamber and the type of process to be carried out.

Conventional methods of monitoring the process chambers, such as polling methods, can be used. When scheduling which process is to be executed, the process sequencer subroutine 255 can be designed to take into consideration the present condition of the process chamber being used in comparison with the desired process conditions for a selected process, or the "age" of each particular user-entered request, or any other relevant factor a system programmer desires to include for determining scheduling priorities.

Once the process sequencer subroutine 255 determines which process chamber and process set combination is going to be executed next, the process sequencer subroutine 255 initiates execution of the process set by passing the particular process set parameters to a chamber manager subroutine 257a–c which controls multiple processing tasks in the process chamber according to the process set determined by the process sequencer subroutine 255. For example, the chamber manager subroutine 257a has program code for controlling CVD and cleaning process operations in the process chamber. Chamber manager subroutine 257 also controls execution of various chamber component subroutines which control operation of the chamber components necessary to carry out the selected process set. Examples of chamber component subroutines are substrate positioning subroutine 260, process gas control subroutine 263, pressure control subroutine 265, heater control subroutine 267, plasma control subroutine 270, endpoint detect control subroutine 259, and gettering control subroutine 269.

Depending on the specific configuration of the CVD chamber, some embodiments include all of the above subroutines, while other embodiments may include only some of the subroutines. Those having ordinary skill in the art would readily recognize that other chamber control subroutines can be included depending on what processes are to be performed in the process chamber.

In operation, the chamber manager subroutine 257a selectively schedules or calls the process component subroutines in accordance with the particular process set being executed. The chamber manager subroutine 257a schedules the process component subroutines much like the process sequencer subroutine 255 schedules which process chamber and process set are to be executed next. Typically, the chamber manager subroutine 257a includes steps of monitoring the various chamber components, determining which components need to be operated based on the process parameters for the process set to be executed, and initiating execution of a chamber component subroutine responsive to the monitoring and determining steps.

Operation of particular chamber component subroutines will now be described with reference to FIGS. 1A and 1C. The substrate positioning subroutine 260 comprises program code for controlling chamber components that are used to load the substrate onto the heater 110 and, optionally, to lift the substrate to a desired height in the chamber to control the spacing between the substrate and the gas distribution manifold 106. When a substrate is loaded into the process chamber 35, the heater 110 is lowered to receive the substrate and then the heater 10 is raised to the desired height. In operation, the substrate positioning subroutine 260 controls movement of the heater 10 in response to process set parameters related to the support height that are transferred from the chamber manager subroutine 257a.

The process gas control subroutine 263 has program code for controlling process gas composition and flow rates. The process gas control subroutine 263 controls the state of safety shut-off valves, and also ramps the mass flow controllers up or down to obtain the desired gas flow rate. Typically, the process gas control subroutine 263 operates by opening the gas supply lines and repeatedly (i) reading the necessary mass flow controllers, (ii) comparing the readings to the desired flow rates received from the chamber manager subroutine 257a, and (iii) adjusting the flow rates of the gas supply lines as necessary. Furthermore, the process gas control subroutine 263 includes steps for monitoring the gas flow rates for unsafe rates, and activating the safety shut-off valves when a fault or an unsafe condition is detected. Alternative embodiments could have more than one process gas control subroutine, each subroutine controlling a specific type of process or specific sets of gas lines.

In some processes, an inert gas, such as nitrogen or argon, is flowed into the chamber to stabilize the pressure in the chamber before reactive process gases are introduced. For these processes, process gas control subroutine 263 is programmed to include steps for flowing the inert gas into the chamber for an amount of time necessary to stabilize the pressure in the chamber, and then the steps described above would be carried out.

Additionally, when a process gas is to be vaporized from a liquid precursor, such as TEOS, process gas control subroutine 263 would be written to include steps for bubbling a delivery gas such as helium through the liquid precursor in a bubbler assembly, or controlling a liquid injection system to spray or squirt liquid into a stream of carrier gas, such as helium, through the LFM. When a bubbler is used for this type of process, the process gas control subroutine 263 regulates the flow of the delivery gas, the pressure in the bubbler, and the bubbler temperature in order to obtain the desired process gas flow rates. As discussed above, the desired process gas flow rates are transferred to the process gas control subroutine 263 as process parameters.

Furthermore, the process gas control subroutine 263 includes steps for obtaining the necessary delivery gas flow rate, bubbler pressure, and bubbler temperature for the desired process gas flow rate by accessing a stored table containing the necessary values for a given process gas flow rate. Once the necessary values are obtained, the delivery gas flow rate, bubbler pressure and bubbler temperature are monitored, compared to the necessary values and adjusted accordingly.

The process gas control subroutine 263 also includes steps for detecting clogging of components of the gas delivery system, and for alerting the operator or shutting down the system in the event of clogging. Specifically, as described in detail below in connection with FIG. 2, clogging of an injection valve or other component of the gas delivery system may be indicated by an elevated pressure upstream of the mass flow controller that provides a flow of gas to the injection valve. Alternatively or in conjunction with pressure sensing, clogging may also be revealed by a change in temperature of the mass flow controller component, as it attempts and fails to flow a mass set-point through a clogged valve. In either case, the mass flow controller temperature or the pressure upstream of the mass flow controller can be monitored by the process gas control subroutine, with a fault indicated or system shut-down initiated where the temperature or pressure parameters reveal clogging of the line.

The pressure control subroutine 265 comprises program code for controlling the pressure in the chamber by regulating the aperture size of the throttle valve in the exhaust system of the chamber. The aperture size of the throttle valve is set to control the chamber pressure at a desired level in relation to the total process gas flow, the size of the process chamber, and the pumping set-point pressure for the exhaust system. When the pressure control subroutine 265 is invoked, the desired or target pressure level is received as a parameter from the chamber manager subroutine 257a. The pressure control subroutine 265 measures the pressure in the chamber by reading one or more conventional pressure manometers connected to the chamber, compares the measure value(s) to the target pressure, obtains proportional, integral, and differential ("PID") values corresponding to the target pressure from a stored pressure table, and adjusts the throttle valve according to the PID values.

Alternatively, the pressure control subroutine 265 can be written to open or close the throttle valve to a particular aperture size, i.e. a fixed position, to regulate the pressure in the chamber. Controlling the exhaust capacity in this way does not invoke the feedback control feature of the pressure control subroutine 265.

The heater control subroutine 267 comprises program code for controlling the current to a heating unit that is used to heat the substrate. The heater control subroutine 267 is also invoked by the chamber manager subroutine 257a and receives a target, or set-point, temperature parameter. The heater control subroutine 267 measures the temperature by measuring voltage output of a thermocouple located in the heater, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. The heater control subroutine 267 includes the ability to gradually control a ramp up or down of the heater temperature. This feature helps to reduce thermal cracking in the ceramic heater. Additionally, a built-in fail-safe mode can be included to detect process safety compliance, and can shut down operation of the heating unit if the process chamber is not properly set up.

II. Gas Delivery System

Figure 2:
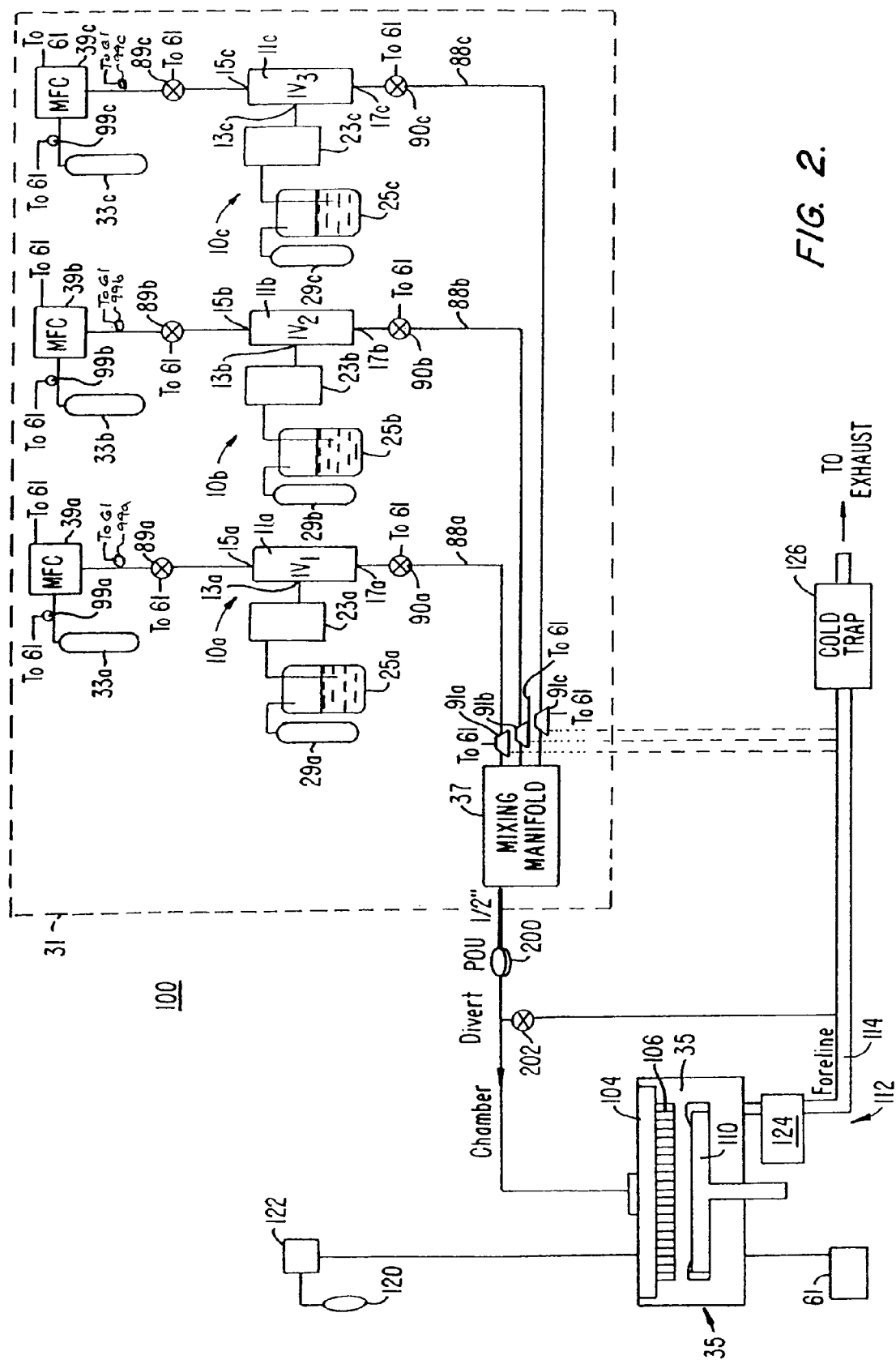
FIG. 2 is a schematic diagram of a chemical vapor deposition system including an embodiment of a gas delivery system in accordance with the present invention.

FIG. 2 is a schematic diagram of an embodiment of a chemical vapor deposition (CVD) system 100 including a gas delivery system 31 in accordance with the present invention. Gas delivery system 31 is in fluid communication with processing chamber 35 through mixing manifold 37. In the example of FIG. 2, the processing chamber 35 is a CVD chamber configured to deposit silicon dioxide by flowing vaporized TEPO, tetraethyl orthosilicate (TEOS), and tetraethyl borate (TEB) into the processing chamber 35. However, embodiments in accordance with the present invention are not limited to this specific application, and may include two, four, or an even greater number of separate, devoted lines for delivering a variety of gases and vaporized liquids.

Chemical vapor deposition (CVD) system 100 generally includes a chamber 35, a chamber lid 104 having a gas distributor 106, with the gas delivery system 31 fluidly connected to gas distributor 106 to deliver one or more processing gases into chamber 35. A substrate support member 110 is disposed in the chamber. A vacuum exhaust system 112 is connected to a gas outlet or foreline 114 of the chamber 102, and a system controller 61 is connected to control operation of the CVD system 100. Specific examples of CVD systems utilizing gas delivery apparatuses and methods in accordance with embodiments of the present invention include the Ultima HDP-CVD™ chamber/system and the DXZ™ chamber/system, which are available from Applied Materials, Inc. of Santa Clara, Calif.

The substrate support member 110 is typically made of a ceramic or aluminum nitride (AlN) and may include a heater such as a resistive heating coil disposed inside the substrate support member, and may also include substrate chucking mechanisms for securely holding a substrate, such as a vacuum chuck or an electrostatic chuck. The gas distributor 106 may comprise a showerhead type gas distributor or a plurality of injection nozzles, for providing a uniform process gas distribution over a substrate disposed on the substrate support member 110. A temperature control system, such as a resistive heating coil and/or thermal fluid channels, may be disposed in thermal connection with the lid and the gas distributor 106. The temperature control system maintains the temperature of the gas distributor 106 within a desired range throughout processing. While gas distributor 106 is fluidly connected to the gas delivery system 31, gas distributor 106 may also be fluidly connected to one or more additional gas sources 120 through one or more additional mass flow controllers 122.

The exhaust system 112 includes one or more vacuum pumps 124, such as a turbomolecular pump, connected to exhaust gases from and maintain vacuum levels in the chamber 102. The one or more vacuum pumps 124 are connected to the foreline 114 for exhausting gases through a valve such as a gate valve. One or more cold traps 126 may be disposed on foreline 114 to remove or condense particular gases exhausted from the chamber.

Gas delivery system 31 comprises three processing liquid vaporization stages 10a–c in fluid communication with processing chamber 35 through devoted delivery lines 88a–c respectively. First stage 10a comprises a first injection valve 11a coupled to a source of liquid TEB 25a via a first liquid flow meter 23a. Second stage 10b comprises a second injection valve 11b coupled to a source of liquid TEOS 25b via a second liquid flow meter 23b. Third stage 10c comprises a third injection valve 11c coupled to a source of liquid TEPO 25c via a third liquid flow meter 23c. Each source of processing liquid 25a–c is coupled to a respective source of pressurized helium 29a–c.

The gas delivery system of FIG. 2 supplies carrier gas to each vaporization stage through separate carrier gas sources 33a–c controlled by separate, devoted mass flow controllers (MFCs) 39a–c respectively. Each mass flow controller is in communication with controller 61, allowing for control over the mass flow controller, and for monitoring of the temperature of the mass flow controller for clog-detection purposes.

In addition, pressure sensors 99a–c are positioned on delivery lines 88a–c, between carrier gas sources 33a–c and mass flow controllers 39a–c, respectively. Alternatively or in conjunction with their placement between the carrier gas sources and the mass flow controllers, as shown in FIG. 2 pressure sensors 99a–c may also be positioned on delivery lines 88a–c between mass flow controllers 39a–c and varporization stages 10a–c, respectively. Pressure sensors 99a–c are also in communication with controller 61 to provide data regarding possible clogging of the injection valves downstream. Memory 50 of controller 61 may include a computer-readable program embodied therein for directing operation of the first and second mass flow controllers. The computer-readable program may include a first set of computer instructions for comparing a pressure upstream of at least one of the first and second mass flow controllers relative to a setpoint pressure, and a second set of instructions for automatically alerting an operator to a possible fault and/or halting operation of the apparatus when the pressure upstream of the first or second mass flow controllers deviates by a predetermined amount from the setpoint pressure. Alternatively or in conjunction with the detection of clogging through line pressure monitoring, memory 50 of controller 61 may include a computer readable program in accordance with the present invention to detect clogging through deviation in the temperature of the mass flow controllers from a setpoint temperature.

The carrier gas flowed from devoted carrier gas sources 33a–c vaporizes processing liquid within stages 10a–c of gas delivery system 31, respectively. Flow into and out of vaporization stages 10a–c is controlled by valves positioned on the gas delivery lines both upstream and downstream of the vaporization stages. Specifically, upstream shut off valves 89a–c control the flow of carrier gas through lines 88a–c to vaporization stages 10a–c, respectively. Final valves 90a–c positioned downstream from vaporization stages 10a–c respectively, govern the flow of the carrier gas/vaporized liquid mixture from vaporization stages 10a–c to the mixing manifold 37.

The outlet of the first devoted delivery line 88a, the outlet of the second devoted delivery line 88b, and the outlet of the third devoted delivery line 88c, join at a mixing manifold 37 positioned downstream of injection valves 11a, 11b, and 11c. Thus, vaporized TEB, TEOS and TEPO are maintained separately within each line 88a–c respectively, of the gas delivery system 31 until mixing, thereby avoiding unwanted processing liquid reactions and the resulting residue that may plague conventional gas delivery systems. Specifically, $H_3PO_4$, which is both an impurity found in TEPO and a by-product of the reaction between TEPO and nickel (e.g., the nickel found in various stainless steel components of the gas delivery system 31), does not contact and react with the TEPO until the $H_3PO_4$ reaches the mixing manifold 37.

In certain embodiments in accordance with the present invention, the mixing manifold is positioned relatively far downstream from the injection valves. For example, in an embodiment where the diameter of the delivery lines is ¼", the mixing manifold is positioned at least 2' downstream of the injection valves. In embodiments featuring delivery lines having a larger diameter, it may be desirable to separate the injection valves from the mixing manifold by an even greater distance.

Mixing manifold 37 may comprise a flow member having a different cross-section than the upstream delivery lines, with the abrupt change in flow cross-section induced by movement of the gases into mixing manifold 37 giving rise to turbulence that promotes gas mixing. In specific embodiments, the diameter of the mixing manifold is larger than that of the flow lines (for example ¼" and most preferably between ⅜" and ½" where the flow lines are ¼" in diameter) to order to further reduce the possibility of clogging. Moreover, where mixing manifold 37 comprises a larger-diameter pipe structure, it can quickly and inexpensively be cleaned or replaced should clogging occur. In other embodiments of the present invention, it is advantageous for mixing manifold 37 not to contain small diameter regions and/or small orifices such as those found in processing liquid vaporization stages such as bubblers and injection valves, which can become clogged.

During operation, an inert carrier gas such as helium flows from the gas sources 33a–c into flow controllers 39a–c respectively, and the flow controllers 39a–c are set at a first flow rate. Within each vaporization stage 10a–c, the processing liquid is vaporized as described with reference to FIG. 3 below. Thus, a mixture of vaporized TEB and helium flows from outlet 17a of the first injection valve 1 a through final valve 90a and divert valve 91a to the mixing manifold 37. A mixture of vaporized TEOS and helium flows from outlet 17b of the second injection valve 11b through final valve 90b and divert valve 91b to the mixing manifold 37, and a mixture of vaporized TEPO and helium flows from outlet 17c of the third injection valve 11c through final valve 90c and divert valve 91c to the mixing manifold 37.

The combined vaporized TEB, TEOS, TEPO, and the helium flowed into the mixing manifold 37 experiences mixing, and any resulting solid particulate matter is removed by point-of-use (POU) filter 200. While not limited to any particular pore size or manufacturer, an example of a filter utilized in this particular application is the 0.003 μm pore filter manufactured for semiconductor fabrication applications by Millipore of Bedford, Mass. After passing through filter 200, the filtered mixture then flows to the processing chamber 35 where the chamber pressure and temperature causes the TEB, TEOS and TEPO to react to form a doped silicon dioxide layer on a substrate (not shown) positioned within the processing chamber 35. Divert valve 202 is positioned immediately downstream of point-of-use filter 200. Activation of divert valve 202 shunts the mixture of processing components into foreline 114 and away from processing chamber 35 for disposal.

Figure 3:
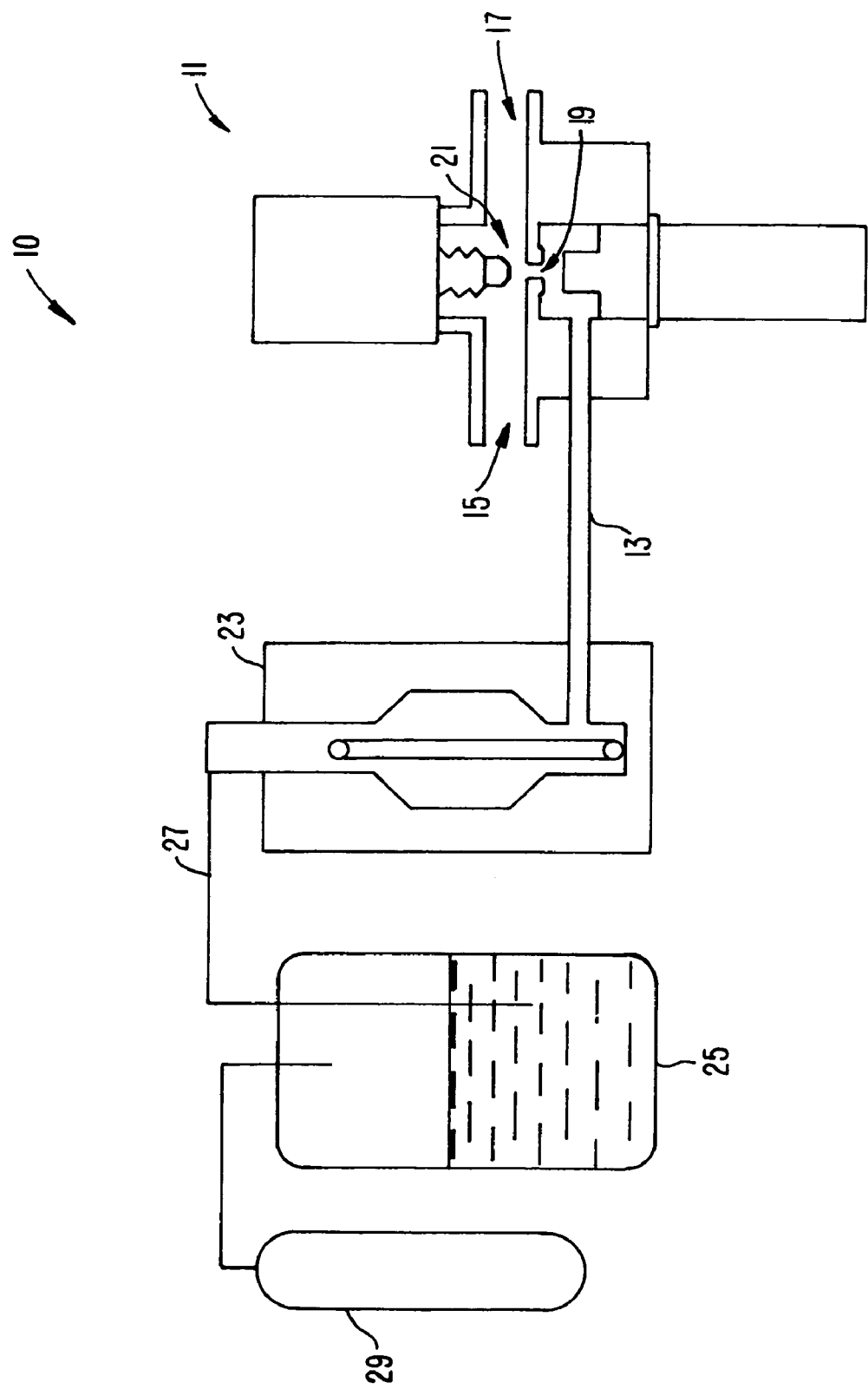
FIG. 3 is a diagrammatic side elevational view of a generic vaporization stage comprising a conventional injection valve useful in describing the preferred embodiment of the invention.

FIG. 3 is a diagrammatic side elevational view of a generic vaporization stage 10 of the gas distribution apparatus 31 shown in FIG. 2. Vaporization stage 10 comprises a conventional injection valve 11 that comprises a processing liquid inlet 13 for inputting a processing liquid, a carrier gas inlet 15 for inputting an inert carrier gas, and an outlet 17 for outputting a vaporized processing liquid/carrier gas mixture. Processing liquid inlets 13a–c and carrier gas inlets 15a–c are shown in FIG. 2 for vaporization stages 10a–c, respectively. Within each injection valve 11, the processing liquid inlet 13 terminates at an orifice 19 leading to a central gas reaction area 21 where the processing liquid inlet 13, the carrier gas inlet 15, and the outlet 17 meet. The injection valve 11 is configured such that the relative sizes of the orifice 19 and the central region 21, and the pressures, flow rates and relative direction of the processing liquid and carrier gas flow cause a pressure drop within the central region 21, as is conventionally known in the art. This pressure drop causes processing liquid supplied to the processing liquid inlet 13 to vaporize as it passes from the processing liquid inlet 13, through the orifice 19 to the central region 21. In order to facilitate vaporization, the orifice 19 is small, and thus may be vulnerable to clogging by generated residual generated solid material.

Outside the injection valve 11, the processing liquid inlet 13 is coupled to a liquid flow meter (LFM) 23 of the vaporization stage 10 which controls the flow rate of processing liquid traveling to the injection valve 11. The liquid flow meter 23 also is coupled via line 27 to a source of processing liquid 25 within the vaporization stage 10, which in turn is coupled to a source of pressurized helium 29.

In operation, the pressurized helium flow forces the processing liquid from the processing liquid source 25 through line 27 to the liquid flow meter 23. The liquid flow meter 23 controls the flow rate of the processing liquid as it travels from liquid flow meter 23 through the processing liquid inlet 13 and the orifice 19 to the central region 21 of the injection valve 11. A pressurized carrier gas, such as helium, flows through the carrier gas inlet 15 into the central region 21.

The processing liquid vaporizes and mixes with the carrier gas as the processing liquid enters the central region 21, due to the pressure decrease experienced as the processing liquid travels from the orifice 19 to the central region 21. The combined vaporized processing liquid/carrier gas flows from the injection valve 11 via the outlet 17.

Figure 4:
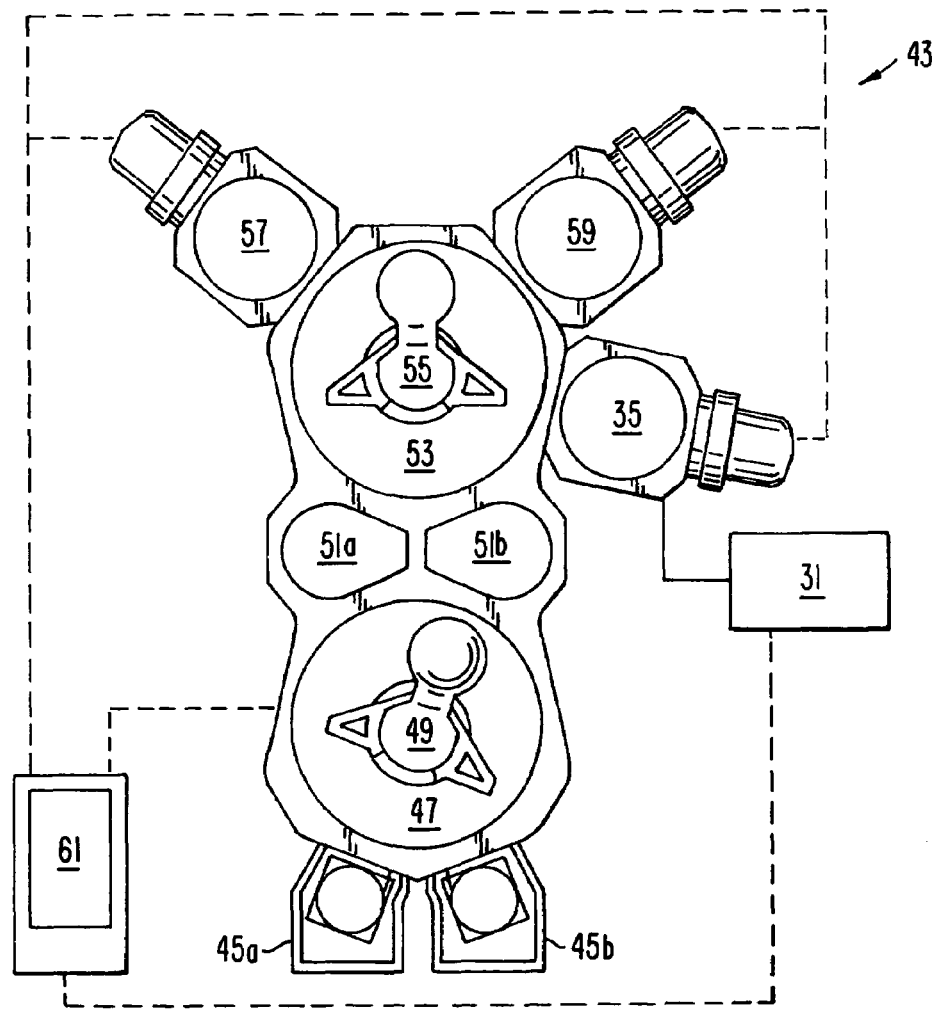
FIG. 4 is a top plan view of an automated tool for semiconductor device fabrication which employs the gas delivery system of FIG. 2.

FIG. 4 is a top plan view of an automated tool 43 for fabricating semiconductor devices. The tool 43 comprises a pair of load locks 45a, 45b, and a first wafer handler chamber 47 containing a first wafer handler 49. The first wafer handler chamber 47 is operatively coupled to the pair of load locks 45a, 45b and to a pair of pass-through chambers 51a, 51b. The pair of pass-through chambers 51a, 51b are further coupled to a second wafer handler chamber 53 (e.g., a transfer chamber), containing a second wafer handler 55, and to a plurality of processing chambers 57, 59. Most importantly, the, second wafer handler chamber 53 is coupled to the processing chamber 35 of FIG. 1 which is further coupled to the inventive gas delivery system 31.

The entire tool 43 is controlled by a controller 61 (which comprises a microprocessor and a memory not shown in FIG. 4) having a program therein, which controls semiconductor wafer transfer among the load locks 45a, 45b, the pass-through chambers 51a, 51b, and the processing chambers 57, 59, 35, and which controls processing therein. As shown in FIG. 2, controller 61 is also in communication with various components of the gas delivery system 31, including mass flow controllers 39a–c, pressure sensors 99a–c, final valves 90a–c, and diversion valves 91a–c.

The controller program and the overall configuration of the tool 43 is designed for optimal productivity. A clogged gas delivery system within such a tool is particularly costly, as it can affect the productivity of the entire tool 43, including the plurality of processing chambers contained therein. Thus, by employing the gas delivery system 31 in accordance with an embodiment of the present invention, the value of the automated semiconductor processing tool 43 increases significantly.

Embodiments of methods and systems in accordance with the present invention offer a number of advantages over conventional liquid vaporization gas delivery techniques. One advantage is a reduction in the propensity of injection valves to experience clogging.

Specifically, conventional gas delivery techniques typically utilize a pressurized carrier gas flow common to a number of injection valves. When one such injection valve experiences clogging, the increased pressure associated with the clogging is relieved by an elevation in the flow rate of carrier gas through the unobstructed valves. As a result of this shift in flow, pressure on the clogged valve continues to drop, thereby promoting additional clogging in a cycle that may ultimately lead to complete obstruction of the affected valve.

By contrast, embodiments in accordance with the present invention utilize separate carrier gas sources and mass flow controllers exclusively devoted to each injection valve. Partial clogging of an injection valve thus cannot be relieved by a shift in gas flow, and the resulting elevated pressure generated by partial clogging can favorably serve to dislodge an obstruction and thereby prevent complete clogging of the valve.

The use of devoted carrier gas sources and flow lines for each injection valve also facilitates monitoring of the health of injection valves of the gas delivery system. For example, conventional approaches may utilize a carrier gas flow common to a plurality of injection valves. When one valve experienced clogging, the resulting constriction in flow was manifested as an increased flow rate distributed in some manner through the unobstructed injection valves.

In accordance with embodiments of the present invention however, exclusivity of the pressurized carrier gas source and corresponding mass flow controller to each injection valve ensures that clogging of an injection valve will be manifest as an increased back pressure. Such an increased back pressure is readily detectable. In one embodiment of the present invention, increased back pressure present on a delivery line attributable to clogging may be detected using a pressure sensor positioned upstream of the mass flow controller. In an alternative embodiment of the present invention, the increased back pressure on a delivery line due to clogging may be detected by monitoring the temperature of the mass flow controller; a change in temperature of the mass flow controller may indicate an inability of the MFC to transport the required volume due to partial or complete clogging of the line. In either case, the MFC or pressure sensor may be in electrical communication with the controller to indicate a fault and to halt tool operation if necessary.

Another potential advantage conferred is resistance to clogging afforded by the relatively high gas conductance of components of gas delivery systems in accordance with the present invention. Specifically, restriction in the flow of vaporized liquids in delivery lines downstream of the injection valves will increase pressure in the gas line and may result in incomplete vaporization of liquids. Therefore, embodiments of the gas delivery systems in accordance with the present invention may further incorporate components exhibiting as large a conductance as possible in order to reduce the incidence of clogging based upon formation of solid residues. For example, embodiments in accordance with the present invention may utilize final and divert valves exhibiting a conductance velocity of at least 0.1 CV. However, preferred embodiments in accordance with the present invention include flow components exhibiting a conductance velocities of 0.2–0.3 CV or even higher. While strictly speaking there is no upper limit in the desirable conductance velocity exhibited by components of gas delivery system in accordance with the present invention, the gauge of the piping and the size of wellments of the valve fittings may impose a practical limit on the gas conductance of a given system.

Yet another advantage conferred by embodiments in accordance with the present invention is the ability to rapidly and precisely alter the ratio of concentration of the various gases in a step-wise fashion. For example, the flow of the liquid precursor into the vaporizer is typically controlled by a liquid flow meter. The response time of the vapor supply into the chamber typically depends upon a number of factors, including but not limited to the LFM PID (proportional-integral-differential) control, the liquid vaporizer control valve (injection valve) configuration, the liquid flow rate, the liquid supply pressure, the carrier gas flow rate, the chamber pressure, and other factors. For a properly tuned liquid injection system, the response time prior to achieving stable process gas flow in the chamber is typically about six to ten seconds.

Figure 5:
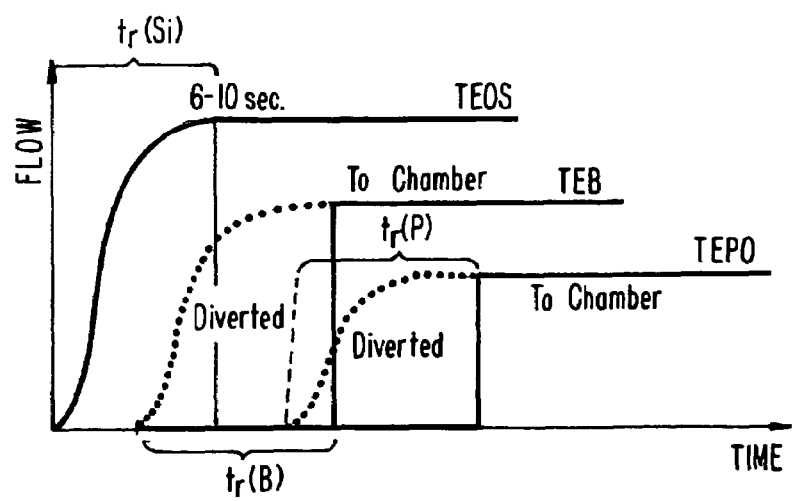
FIG. 5 is a graphical illustration showing the standard flow response of vaporized liquid of a typical gas delivery system.

FIG. 5 is a graphical illustration showing the standard flow response of vaporized liquid of a typical liquid injection system. The transient state due to the inherent rise time effect of the LFM before liquid stabilizes to set point flow (indicated by $t_r$), varies from liquid to liquid and from chamber to chamber. The transient film property at the film interface where film starts to grow can not be controlled, and results in uncontrolled and inconsistent dopant concentration.

One example of a problem arising due to transient film properties is formation of voids at the interface of a BPSG layer and a nitride layer. Another possible problem associated with transient film properties is the consumption of nitride during steam annealing steps, where a high concentration of phosphorous in the initial BPSG film react with water vapor to form phosphoric acid which in turn consumes the nitride. Still another problem associated with transient film properties is inconsistent dopant concentration, particularly at the interfaces with other materials, which may result in nonuniform processing and the formation of defective semiconductor devices.

Transient film properties become even more significant when the deposition process is short as compared to the time for stabilizing process gas flow. For example, where a particular process recipe requires a dopant to be introduced for about 12 seconds into the chamber, but the $t_r$ of the LFM providing a particular component is 6–10 sec, a majority of the doping process will be required to stabilize the process gas flow. Moreover, this gas flow stabilization period may vary each time the process is performed, resulting in inconsistent and unrepeatable processing.

Embodiments in accordance with the present invention avoid the problems associated with transient film properties by providing separate, devoted divert valves 91 $a$–$c$ on each of the separate parallel delivery lines 88$a$–$c$ leading into mixing manifold 37. By selectively actuating divert valves 91 $a$–$c$ to shunt the flowed gases directly to the foreline during the gas flow stabilization period, upon deactuation of divert valves 91 $a$–$c$ the vaporized liquid actually flowed into mixing manifold 37 exhibits a stabilized character and avoids the transient film properties. This ability to deliver stable vaporized liquids in a step-wise fashion to a processing chamber and avoid transient film properties is discussed in detail in U.S. patent application Ser. No. 2002/0000195 A1 entitled "Concentration Profile on Demand Gas Delivery System (Individual Divert Delivery System)", commonly assigned with the instant application and incorporated by reference herein for all purposes.

Still another advantage conferred by embodiments in accordance with the present invention is reduction in clogging propensity afforded by the distal location of the injection valves relative to the mixing manifold. Specifically, injection valves in accordance with embodiments of the present invention are deliberately positioned upstream from the mixing manifold at a distance of 2 ft. or greater. This distance between the injection valves and the first possible point of generation of potentially valve-clogging solid residues reduces the tendency of such particles to enter and obstruct the injection valves.

The foregoing description discloses only specific embodiments in accordance with the present invention, and modifications of the above disclosed apparatuses and methods falling within the scope of the invention will be apparent to those of ordinary skill in the art. For example, the present invention may reduce clogging within any processing environment wherein mixed processing constituents may react to form an undesirable product that can clog the various components within a gas delivery system.

Moreover, while the particular embodiment of FIG. 2 shows the mixing manifold as positioned between the processing chamber and the gas delivery system, this configuration is not required by the present invention. Embodiments of apparatuses which include the mixing manifold as part of the processing chamber or as part of the gas delivery system would also fall within the scope of the present invention.

And while the embodiments shown and described above in connection with FIGS. 1A–5 focus upon a gas delivery system wherein vaporized processing liquids are delivered to a chamber, this is not required by the present invention. An apparatus or method could deliver one or more reactive processing gases to a chamber that are not derived from vaporized liquids, and still remain within the scope of the present invention.

Additionally, while the specific embodiment shown and described above in connection with FIGS. 1A–5 focus upon delivery of three vaporized liquids to a processing chamber, the present invention is not limited to the specific delivery of three vaporized processing liquids, nor to delivery of the specific processing liquids described (TEB, TEPO, TEOS). Other liquid processing materials which may be vaporized prior to processing in the fabrication of semiconductors include, but are not limited to, titanium tetrachloride ($TiCl_4$), trimethylsilane ($SiH(CH_3)_3$), tetramethylsilane ($Si(CH_3)_4$), tetramethylcyclotetrasiloxane (TOMCATS), dimethyldimethoxysilane (Z2DM), trimethyl phosphite (TMPI), trimethylphosphate (TMPO), trimethylborate (TMB), phosphorus oxychloride ($POCl_3$), boron tribromide ($BBr_3$), bis(tertiary-butylamino)silane (BTBAS), tantalum pentaethoxide (TAETO), tantalum tetraethoxide dimethylaminoethoxide (TAT-DMAE), tert-butylimino tris(diethylamino) tantalum (TBTDET), tetrakis-diethylamino titanium (TDEAT), and tetrakis-dimethylamino titanium (TDMAT).

Further, it will be understood that the exemplary gas delivery system may contain additional components (e.g., valves, flow meters, etc.), and the various components of the gas delivery system can be made with reduced nickel content and increased chromium content to further reduce formation of residues. Finally, although the benefits of the inventive gas delivery system are most dramatic when used with injection valves, other vaporization mechanisms such as bubblers may also be employed.

Accordingly, while the present invention has been disclosed in connection with the preferred embodiments thereof, it should be understood that other embodiments may fall within the spirit and scope of the invention, as defined by the following claims.

What is claimed is:

1. An apparatus for providing to a semiconductor processing chamber a first processing gas and a second processing gas reactive with the first processing gas, the apparatus comprising:
    a mixing structure in fluid communication with the processing chamber;
    a first gas delivery line in fluid communication with the mixing structure;
    a first carrier gas source in fluid communication with the first gas delivery line through a first mass flow controller and upstream of the mixing structure;
    a first liquid source;
    a first pressurizing gas source in fluid communication with the first liquid source to vaporize the first liquid, the first gas delivery line in fluid communication with a first vaporization stage for combining the vaporized first liquid with a flow of the first carrier gas; and
    a second gas delivery line separate from the first gas delivery line and in fluid communication with the mixing structure;
    a second carrier gas source separate from the first carrier gas source, in fluid communication with the second gas delivery line through a second mass flow controller separate from the first mass flow controller, and upstream of the mixing structure;
    a second liquid source; and
    a second pressurizing gas source in fluid communication with the second liquid source to vaporize the second liquid, the second gas delivery line in fluid communication with a second vaporization stage for combining the vaporized second liquid with a flow of the second carrier gas,
    wherein the apparatus has a component configured to exhibit a conductance velocity of at least 0.3 CV.

2. The apparatus of claim 1 further comprising a filter positioned between the mixing structure and the processing chamber.

3. The apparatus of claim 2 wherein the first vaporization stage comprises a first injection valve configured to combine the vaporized first liquid with the flow of the first carrier gas.

4. The apparatus of claim 1 further comprising:
    a third gas delivery line separate from the first and second gas delivery lines and in fluid communication with the mixing structure;
    a third carrier gas source separate from the first and second carrier gas sources in fluid communication with the third gas delivery line through a third mass flow controller separate from the first and second mass flow controllers and upstream of the mixing structure;
    a third liquid source; and
    a third pressurizing gas source in fluid communication with the third liquid source to vaporize the third liquid, the third gas delivery line in fluid communication with a third vaporization stage for combining the vaporized third liquid with a flow of the third carrier gas.

5. The apparatus of claim 1 further comprising a system controller in electrical communication with the first mass flow controller and with the second mass flow controller.

6. The apparatus of claim 5 wherein the system controller comprises:
    a processor configured to regulate the first and second mass flow controllers; and a memory, coupled to the processor, comprising a computer-readable medium having a computer-readable program embodied therein for directing operation of the first and second mass flow controllers, the computer-readable program including:
(i) a first set of computer instructions for comparing a temperature of at least one of the first and second mass flow controllers relative to a setpoint temperature; and
(ii) a second set of instructions for at least one of automatically alerting an operator to a possible fault and halting operation of the, apparatus, when the temperature of the at least one of the first and second mass flow controllers deviates by a predetermined amount from the setpoint temperature.

7. The apparatus of claim 5 further comprising a pressure sensor in electrical communication with the system controller and positioned between the first mass flow controller and the first vaporization stage.

8. The apparatus of claim 7 wherein the system controller comprises:
a processor configured to regulate the first and second mass flow controllers; and
a memory coupled to the processor and comprising a computer-readable medium having a computer-readable program embodied therein for directing operation of the first and second mass flow controllers, the computer-readable program including:
(i) a first set of computer instructions for comparing a pressure of the pressure sensor relative to a setpoint pressure; and
(ii) a second set of instructions for at least one of automatically alerting an operator to a possible fault and halting operation of the apparatus, when the sensed pressure deviates by a predetermined amount from the setpoint pressure.

9. The apparatus of claim 1 further comprising a first divert valve positioned between the first vaporization stage and the mixing structure, the first divert valve in selective fluid communication with an exhaust.

10. The apparatus of claim 1 wherein a flow distance between the first vaporization stage and the mixing structure is at least 2 ft.

11. An apparatus for processing a semiconductor substrate comprising:
a processing chamber comprising a chamber lid and walls enclosing a substrate support, a gas distributor, and a vacuum exhaust connected to a chamber outlet;
a gas delivery system in fluid communication with the gas distributor, the gas delivery system comprising,
a mixing structure in fluid communication with the processing chamber,
a first gas delivery line in fluid communication with the mixing structure;
a first carrier gas source in fluid communication with the first gas delivery line through a first mass flow controller and upstream of the mixing structure;
a first liquid source;
a first pressurizing gas source in fluid communication with the first liquid source to vaporize the first liquid, the first gas delivery line in fluid communication with a first vaporization stage for combining the vaporized first liquid with a flow of the first carrier gas;
a second gas delivery line separate from the first gas delivery line and in fluid communication with the mixing structure;
a second carrier gas source separate from the first carrier gas source, in fluid communication with the second gas delivery line through a second mass flow controller separate from the first mass flow controller, and upstream of the mixing structure;
a second liquid source;
a second pressurizing gas source in fluid communication with the second liquid source to vaporize the second liquid, the second gas delivery line in fluid communication with a second vaporization stage for combining the vaporized second liquid with a flow of the second carrier gas; and
a system controller comprising a memory and a processor, the processor in electrical communication with the memory and with the first and second mass flow controllers,
wherein the apparatus has a component configured to exhibit a conductance velocity of at least 0.3 CV.

12. The apparatus of claim 11 wherein the first vaporization stage comprises a first injection valve configured to combine the vaporized first liquid with the flow of the first carrier gas.

13. The apparatus of claim 11 further comprising:
a third gas delivery line different from the first and second gas delivery lines and in fluid communication with the mixing structure;
a third carrier gas source separate from the first and second carrier gas sources in fluid communication with the third gas delivery line through a third mass flow controller separate from the first and second mass flow controllers and upstream of the mixing structure;
a third liquid source; and;
a third pressurizing gas source in fluid communication with the third liquid source to vaporize the third liquid, the third gas delivery line in fluid communication with a third vaporization stage for combining the vaporized third liquid with a flow of the third carrier gas.

14. The apparatus of claim 13 wherein the processing chamber comprises a chemical vapor deposition chamber.

15. The apparatus of claim 11 further comprising:
a pressure sensor in electronic communication with the processor and positioned upstream of the first mass flow controller; and
a computer-readable program embodied in the memory for directing operation of the first and second mass flow controllers, the computer-readable program including:
(i) a first set of computer instructions for comparing a pressure of the pressure sensor relative to a setpoint pressure; and
(ii) a second set of instructions for at least one of automatically alerting an operator to a possible fault and halting operation of the apparatus, when the sensed pressure deviates by a predetermined amount from the setpoint pressure.

16. The apparatus of claim 11 further comprising a computer-readable program embodied in the memory for directing operation of the first and second mass flow controllers, the computer-readable program including:
(i) a first set of computer instructions for comparing a sensed operating temperature of at least one of the first and the second mass flow controllers relative to a setpoint temperature; and
(ii) a second set of instructions for at least one of automatically alerting an operator to a possible fault and halting operation of the apparatus, when the sensed operating temperature deviates by a predetermined amount from the setpoint temperature.

17. The apparatus of claim 11 further comprising a filter positioned between the mixing structure and the processing chamber.

18. The apparatus of claim 11 wherein a flow distance between the first vaporization stage and the mixing structure is at least 2 ft.

* * * * *